(12) United States Patent
Tailliet

(10) Patent No.: US 8,994,022 B2
(45) Date of Patent: Mar. 31, 2015

(54) METHOD OF EVALUATING A SEMICONDUCTOR WAFER DICING PROCESS

(75) Inventor: Francois Tailliet, Fuveau (FR)

(73) Assignee: STMicroelectronics Rousset SAS, Rousset (FR)

( * ) Notice: Subject to any disclaimer, the term of this patent is extended or adjusted under 35 U.S.C. 154(b) by 46 days.

(21) Appl. No.: 13/443,778

(22) Filed: Apr. 10, 2012

(65) Prior Publication Data

US 2012/0256180 A1 Oct. 11, 2012

(30) Foreign Application Priority Data

Apr. 11, 2011 (FR) ...................................... 11 53157

(51) Int. Cl.
*H01L 29/788* (2006.01)
*H01L 21/66* (2006.01)

(52) U.S. Cl.
CPC ...................................... *H01L 22/34* (2013.01)
USPC ............... 257/48; 257/E23.002; 257/E21.529

(58) Field of Classification Search
USPC ............................. 257/48, E23.002, E21.529
See application file for complete search history.

(56) References Cited

U.S. PATENT DOCUMENTS

| | | | | |
|---|---|---|---|---|
| 5,501,104 A * | 3/1996 | Ikeda et al. | ...................... | 73/629 |
| 6,365,958 B1 * | 4/2002 | Ibnabdeljalil et al. | ........ | 257/620 |
| 6,833,720 B1 * | 12/2004 | Daubenspeck et al. | .. | 324/750.16 |
| 7,250,311 B2 * | 7/2007 | Aoki et al. | ...................... | 438/14 |
| 7,256,475 B2 * | 8/2007 | Jao et al. | ........................ | 257/622 |
| 7,388,385 B1 | 6/2008 | Iacob | | |
| 7,394,270 B2 * | 7/2008 | Jimi | .......................... | 324/750.18 |
| 7,611,966 B2 * | 11/2009 | Li et al. | ........................... | 438/460 |
| 7,683,627 B2 * | 3/2010 | Tsukuda | ........................ | 324/522 |
| 7,791,070 B2 * | 9/2010 | Huang et al. | ..................... | 257/48 |
| 7,871,832 B2 | 1/2011 | Marinet | | |
| 8,040,140 B2 * | 10/2011 | Ryskoski et al. | .............. | 324/538 |
| 8,159,254 B2 * | 4/2012 | Kaltalioglu | .............. | 324/762.01 |
| 8,217,394 B2 * | 7/2012 | Yang et al. | ....................... | 257/48 |
| 8,497,695 B2 * | 7/2013 | Matoba et al. | .............. | 324/750.3 |
| 2002/0074545 A1 | 6/2002 | Hosier et al. | | |
| 2003/0218254 A1 * | 11/2003 | Kurimoto et al. | .............. | 257/758 |
| 2006/0082003 A1 * | 4/2006 | Shizuno | ......................... | 257/787 |
| 2007/0096092 A1 * | 5/2007 | Huang et al. | ..................... | 257/48 |
| 2007/0102791 A1 * | 5/2007 | Wu | .................................. | 257/618 |
| 2008/0012572 A1 * | 1/2008 | Tsukuda | ......................... | 324/522 |
| 2008/0185685 A1 * | 8/2008 | Nakashiba | ..................... | 257/535 |
| 2008/0203388 A1 * | 8/2008 | He et al. | ........................... | 257/48 |
| 2008/0315196 A1 * | 12/2008 | Aghababazadeh et al. | ..... | 257/48 |
| 2009/0174426 A1 * | 7/2009 | Matoba et al. | ................. | 324/763 |
| 2009/0200549 A1 * | 8/2009 | Chen et al. | ....................... | 257/48 |
| 2009/0201043 A1 * | 8/2009 | Kaltalioglu | ..................... | 324/765 |
| 2009/0289325 A1 * | 11/2009 | Wang et al. | ..................... | 257/510 |
| 2009/0321734 A1 * | 12/2009 | Ogawa et al. | .................... | 257/48 |
| 2010/0078769 A1 * | 4/2010 | West et al. | ...................... | 257/620 |

(Continued)

FOREIGN PATENT DOCUMENTS

JP 10-246742 A 9/1998

*Primary Examiner* — Michael Shingleton

(74) *Attorney, Agent, or Firm* — Seed IP Law Group PLLC

(57) ABSTRACT

Embodiments of the disclosure relate to a method of evaluating a semiconductor wafer dicing process, comprising providing evaluation lines extending in at least one scribe line of the wafer, dicing the wafer in the scribe line, evaluating the length of the evaluation lines, providing an information about their length, and using the information to evaluate the dicing process.

20 Claims, 4 Drawing Sheets

(56) References Cited

U.S. PATENT DOCUMENTS

| | | |
|---|---|---|
| 2010/0109128 A1* | 5/2010 | West et al. .................... 257/620 |
| 2010/0123219 A1* | 5/2010 | Chen et al. .................... 257/620 |
| 2010/0125989 A1 | 5/2010 | Huang et al. |
| 2010/0148314 A1* | 6/2010 | Han .............................. 257/620 |
| 2010/0193918 A1* | 8/2010 | West et al. .................... 257/620 |
| 2010/0304509 A1* | 12/2010 | Aghababazadeh et al. ..... 438/17 |
| 2012/0049884 A1* | 3/2012 | Kaltalioglu ............... 324/762.03 |
| 2012/0256180 A1* | 10/2012 | Tailliet ............................. 257/48 |
| 2013/0009663 A1* | 1/2013 | Gauch et al. ............. 324/762.01 |
| 2013/0316471 A1* | 11/2013 | Tsai et al. ........................ 438/14 |

\* cited by examiner

METHOD OF EVALUATING A SEMICONDUCTOR WAFER DICING PROCESS

BACKGROUND

1. Technical Field

The present disclosure relates to semiconductor wafers and to wafer dicing processes. More particularly, the present disclosure relates to a method of evaluating a wafer dicing process and to an integrated circuit for evaluating a wafer dicing process.

2. Description of the Related Art

FIG. 1A shows a semiconductor wafer 1 comprising a plurality of integrated circuits 10. Each integrated circuit 10 comprises active and passive electronic components such as transistors, resistors, capacitors . . . , as well as contact pads (not shown). The integrated circuits 10 are separated from each other by scribe lines Si. The scribe lines Si have a width w1 generally on the order of 60-100 µm. After a first testing phase of the integrated circuits 10 on the wafer 1, the integrated circuits 10 are separated from each other in a process known as "wafer dicing" or "wafer singulation" to obtain individual dies. This process comprises cutting the wafer according to the scribe lines Si, for example with a laser or a diamond blade. Once separated, the integrated circuits 10 may then be re-tested and packaged.

FIG. 1B shows an integrated circuit 10 after it has been singulated from the wafer 1 to form a die 11. The die 11 comprises a border 12. Due to the dicing process, the border 12 may present uneven edges, as well as defects such as chips 13 or cracks 14. These defects may propagate into the die 11 and reach the integrated circuit 10, particularly if the die is exposed to environmental factors and mechanical stress, causing a failure of the integrated circuit later.

A visual inspection of the edges of the die 11 is performed either by human operators or by machines using form recognition to verify whether the defects are so significant that the die should be rejected. This type of inspection is time consuming, expensive, and not entirely reliable. Furthermore, not all die 11 are inspected due to their large numbers. As a result, damaged integrated circuits 10 can be delivered to customers and fail at an early stage.

It may therefore be desired to provide a means for electronically detecting chips and cracks in the edges of dice.

U.S. Pat. No. 7,871,832 discloses a method for generating a binary number for identifying an integrated circuit. The method includes arranging conductive lines having different lengths around the periphery of each integrated circuit. When the wafer is diced, some of these conductive lines are cut. The continuity state of each conductive line is then sensed, to generate a binary value, 1 or 0, which is representative of whether the conductive line has been cut or remains uncut. The different binary values are then concatenated and used as a chip identifier number.

BRIEF SUMMARY

Embodiments of the disclosure relate to a method of evaluating a semiconductor wafer dicing process, comprising providing evaluation lines extending in at least one scribe line of the wafer, dicing the wafer in the scribe line, evaluating the length of the evaluation lines and providing an information about their length, and using the information to evaluate the dicing process.

According to one embodiment, the evaluation lines are loop-shaped conductive lines and evaluating their length comprises determining whether there is an electrical continuity between two ends of the loop-shaped conductive lines.

According to one embodiment, the evaluation lines form ultra-high frequency (UHF) or radio frequency (RF) antennas and evaluating their length comprises generating an ambient electrical or magnetic field and sensing an AC voltage induced in the conductive lines.

According to one embodiment, the evaluation lines are capacitive lines and evaluating their length comprises sensing a capacitance value of the capacitive lines.

According to one embodiment, the method comprises providing an alternation of short length lines and long length lines, the short length lines having a length which is less than 20% of the width of the scribe line in which they extend.

According to one embodiment, the method comprises providing on the wafer at least one integrated circuit connected to the evaluation lines and comprising an evaluation circuit configured to allow individual evaluation of the length of the evaluation lines, and using the evaluation circuit to evaluate the length of the evaluation lines.

According to one embodiment, the method comprises providing in the wafer at least one evaluation integrated circuit connected to the evaluation lines and specifically provided to allow individual evaluation of the length of the evaluation lines, and providing in the wafer functional integrated circuits intended to be sold, dicing the wafer to transform the functional integrated circuits and the evaluation integrated circuit into dies, and using the evaluation integrated circuit to evaluate the dicing process.

According to one embodiment, the method further comprises rejecting or accepting the functional integrated circuits depending upon the evaluation of the dicing process.

Embodiments of the disclosure also relate to a semiconductor wafer comprising evaluation lines extending in at least one scribe line of the wafer, and at least one integrated circuit connected to the evaluation lines and comprising an evaluation circuit configured to allow individual evaluation of the length of the evaluation lines.

According to one embodiment, the evaluation lines are loop-shaped conductive lines.

According to one embodiment, the evaluation lines form UHF or RF antennas.

According to one embodiment, the evaluation lines are capacitive lines.

According to one embodiment, the semiconductor wafer comprises different groups of evaluation lines, each group comprising an alternation of short length lines and long length lines, the short length lines having a length which is less than 20% of the width of the scribe line in which they extend.

According to one embodiment, the semiconductor wafer comprises at least one evaluation integrated circuit connected to the evaluation lines and specifically provided to allow individual evaluation of the length of the evaluation lines, and functional integrated circuits intended to be sold.

According to one embodiment, the evaluation lines are buried in a wafer material or dielectric layer deposited on the wafer.

BRIEF DESCRIPTION OF THE SEVERAL VIEWS OF THE DRAWINGS

Embodiments of the present disclosure will now be described in connection with, but not limited to, the appended drawings in which.

DETAILED DESCRIPTION

Embodiments of the disclosure relate to a method of evaluating a process of dicing a semiconductor wafer. The method includes the provision of evaluation lines in scribe lines of the wafer. By testing the state of the evaluation lines after singulation, information can be obtained about their length and consequently about the dicing process.

Figure 1A:
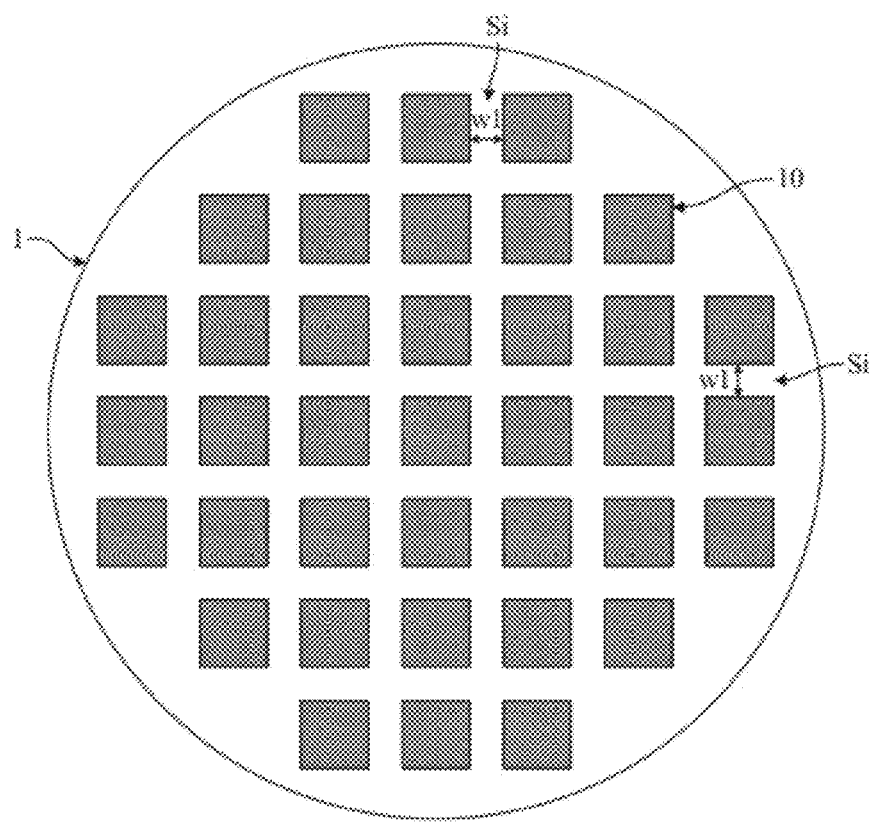
FIG. 1A, previously described, is a top view of a conventional semiconductor wafer comprising a plurality of integrated circuits, FIG. 1B, previously described, is a top view of a conventional integrated circuit after it has been singulated from the semiconductor wafer of FIG. 1A.
Figure 1B:
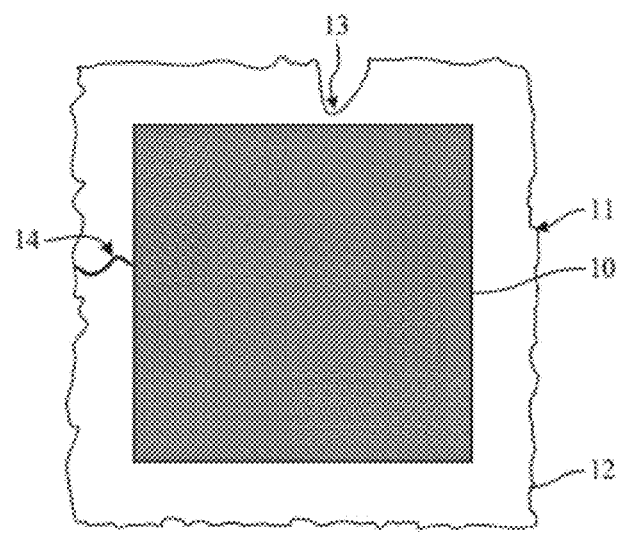
Figure 2:
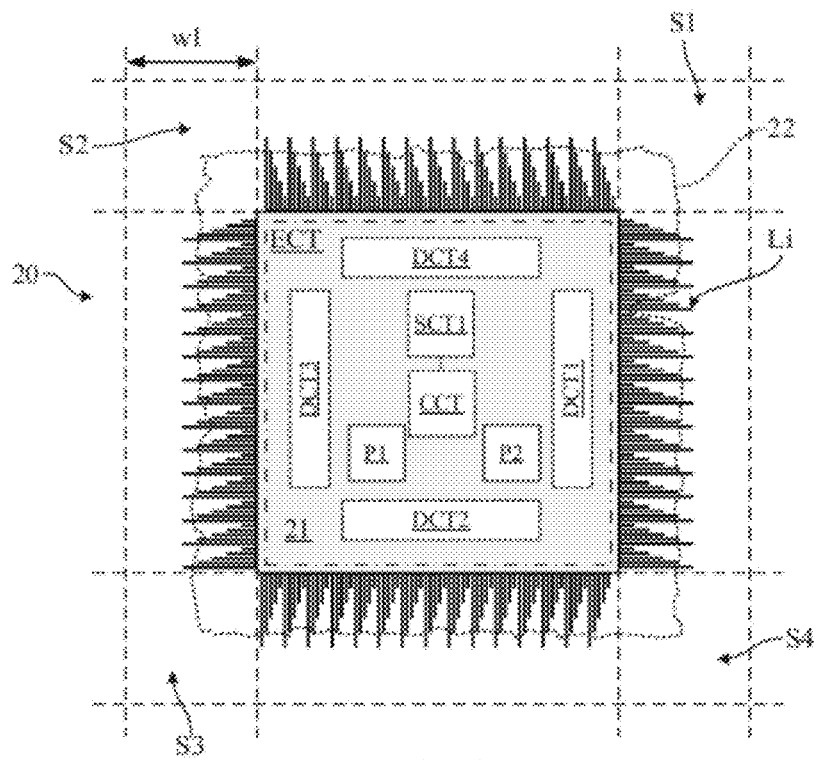
FIG. 2 is a top view of an evaluation integrated circuit according to a first embodiment of the disclosure.

FIG. 2 shows a first embodiment of an evaluation integrated circuit 20 according to the disclosure. The evaluation integrated circuit 20 is arranged on a semiconductor wafer 2 in a manner shown in FIG. 3. The semiconductor wafer 2 comprises a plurality of functional integrated circuits 10 and evaluation integrated circuits 20, 20', 20", 20''', instead of functional integrated circuits 10. By "functional integrated circuits" is meant integrated circuits designed and manufactured in order to be packaged and sold after singulation of the wafer 2. Each evaluation or functional integrated circuit is surrounded by scribe lines Si, the evaluation integrated circuit 20 being surrounded by scribe lines depicted by references S1, S2, S3, S4. It is assumed here that all the scribe lines Si have the same width w1.

Referring again to FIG. 2, the evaluation integrated circuit 20 comprises an integrated circuit region 21 having a rectangular shape and four series of evaluation lines Li extending in the scribe lines S1, S2, S3, S4. In this embodiment, the evaluation lines Li are electrically conductive lines. They extend from the integrated circuit region 21 into the scribe lines S1, S2, S3, S4. On each side of the integrated circuit region 21, each series of conductive lines Li comprises different groups of conductive lines, and each group comprises conductive lines of different lengths.

The evaluation integrated circuit 20 further comprises an evaluation circuit ECT which is designed to evaluate the length of the conductive lines. In this embodiment, the evaluation circuit ECT is configured to provide to an external evaluation computer (not shown) information about the continuity states of the conductive lines. The evaluation circuit ECT comprises a control circuit CCT, a sense circuit SCT1, decoders DCT1, DCT2, DCT3, DCT4 (one per series of conductive lines), and two input/output contact pads P1, P2 linked to the control circuit CCT. Each decoder DCT1-DCT4 allows individual selection of each conductive line Li, so that the continuity state of the conductive line Li may be determined by the sense circuit SCT1.

After dicing of the wafer 2, the evaluation integrated circuit 20 forms a die and may have uneven borders 22 (shown in dotted line). Such uneven borders may comprise defaults such as chips and/or cracks. A conductive line Li is in the non-continuity state, or "cut state", if it has been totally or partially sectioned by the dicing process or by a default such as a crack or a chip. Otherwise, it is in the continuity state, or "uncut state".

By determining the continuity state of each of the conductive lines Li, the approximate shape of borders 22 can be determined without a visual inspection. For example, for each conductive line, information returned by the evaluation circuit ECT is 1 if the conductive line is in the continuity state and 0 if the conductive line is in the non-continuity state.

Figure 4:
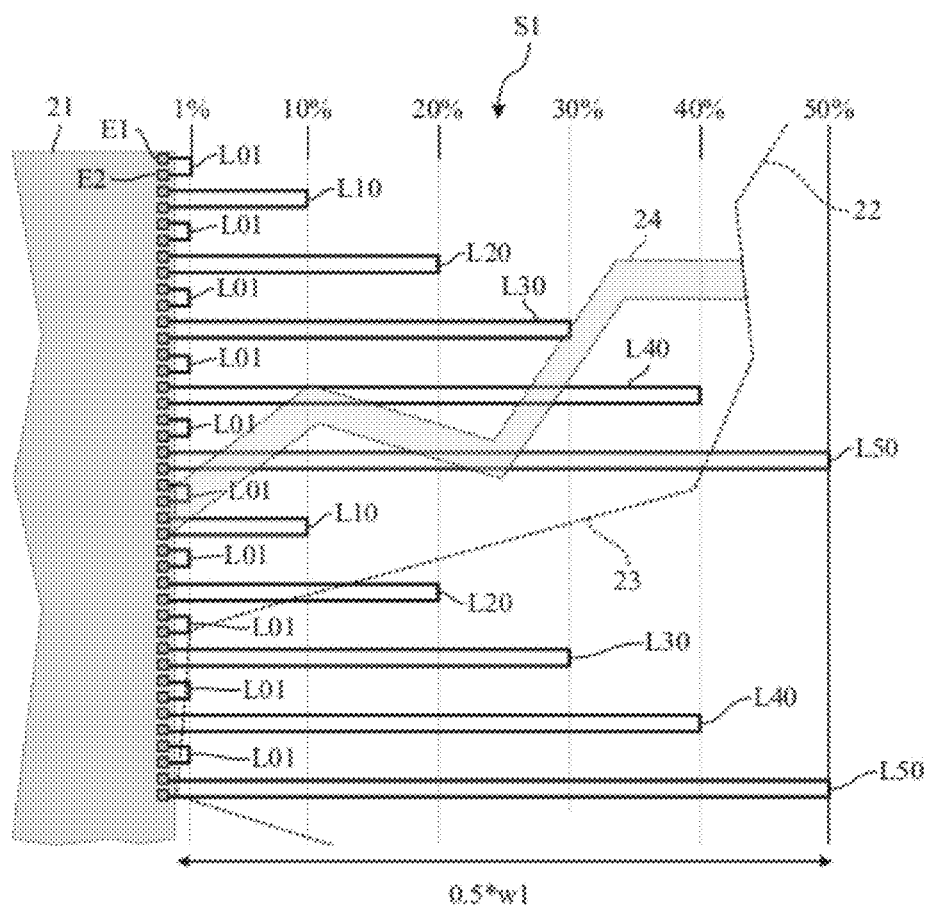
FIG. 4 is an enlarged view of a first embodiment of evaluation lines present in the integrated circuit of FIG. 2.

FIG. 4 shows in further detail an example embodiment of two consecutive groups of conductive lines Li of the series of conductive lines extending into the scribe line S1. Each conductive line Li forms a narrow longitudinal loop and has first and second ends E1, E2 linked to the integrated circuit region 21 (i.e., linked to the evaluation circuit ECT).

Figure 3:
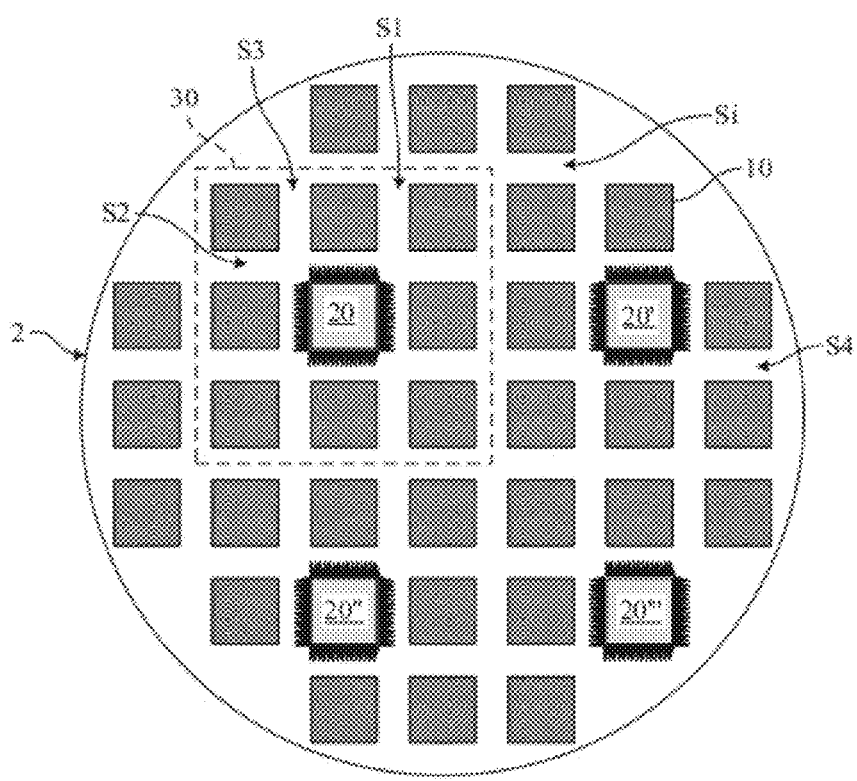
FIG. 3 is a top view of a semiconductor wafer comprising evaluation integrated circuits as shown in FIG. 2.

Each conductive line Li may be made of metal or of a doped silicon region. Therefore, despite that they are shown in FIGS. 2, 3, 4 as surface components, the conductive lines Li may be buried in the wafer material, generally silicon, or in dielectric layers deposited on the wafer. It will be understood that buried conductive lines Li may be preferred to surface conductive lines Li since they allow for deep defaults to be detected, such as deep cracks occurring in the width of the wafer during the dicing process.

In the example shown, the "i" in the conductive line Li represents the length of the conductive line expressed as a percentage of the width w1 of the scribe line S1 in which the conductive line extends. Each group comprises conductive lines L01, L10, L20, L30, L40, L50, that is to say conductive lines extending respectively over 1%, 10%, 20%, 30%, 40%, and 50% of the width w1 of the scribe line S1. In each group of conductive lines, the different conductive lines L01 to L50 may be arranged in various manners depending on the evaluation to be performed, for example L01, L10, L01, L20, L01, L30, L01, L40, L01, L50 for the first group, then again L01, L10, L01, L20, L01, L30, L01, L40, L01, L50 for the second group, etc.

In addition to their length, the width of each conductive line Li and the spacing between successive lines can varying depending on the process parameters, the expected size of chips and cracks, and the required accuracy of the evaluation.

As a numerical example, for a die of 2 mm length per side, if the conductive lines are 50 nm width, and if the distance between two conductive lines is 50 nm, the width of a loop formed by a conductive line is 150 nm, the distance between two loops is 50 nm and the pitch of the series of conductive lines is 200 nm. In this case, 10,000 conductive lines may be arranged on each side of the die. If a default such as a chip is 1 μm wide, five conductive lines may be sectioned by the chip.

By reading the state of the conductive lines Li and analyzing the corresponding data after dicing of the wafer, various parameters may be determined including the width of the blade, the centering of the blade on the middle of the street S1 to S4, the blade wobble (movement of the blade from side to side), etc. Chips 23 and cracks 24 on the borders of the integrated circuit 21 can also be detected, as shown in FIG. 4, since they cause one or more conductive lines Li to be severed. In an embodiment where several layers of superposed conductive lines are provided, the angle of the blade may also be evaluated.

In addition, when the blade was correctly centered, the shorter conductive lines L01, L10 may be used to determine the occurrence of chips 23 or cracks 24 extending too close to the integrated circuit region 21. If so, the die with the evaluation integrated circuit 20 may be considered as a sample of which the state of the border is representative of the states of the borders of the other dies containing functional integrated circuits, in particular those which were arranged in the wafer in the same row or the same column as the evaluation integrated circuit. In that case, such functional integrated circuits may be rejected.

In one embodiment, the information obtained by means of the conductive lines Li may be used to adjust, correct, or set the wafer singulation process, such as by re-centering the blade. To summarize, the number of conductive lines Li, the distance between adjacent lines, the width of each line, the side(s) upon which the conductive lines are to be arranged, etc., will be chosen according to the total width of the scribe lines, the alignment tolerance of the saw, the width of the saw, the process parameters, the desired accuracy in the evaluation, and the like. It is therefore within the purview of the skilled person to implement the conductive lines so as to obtain the desired information about the dicing process of the semiconductor wafer.

Figure 5:
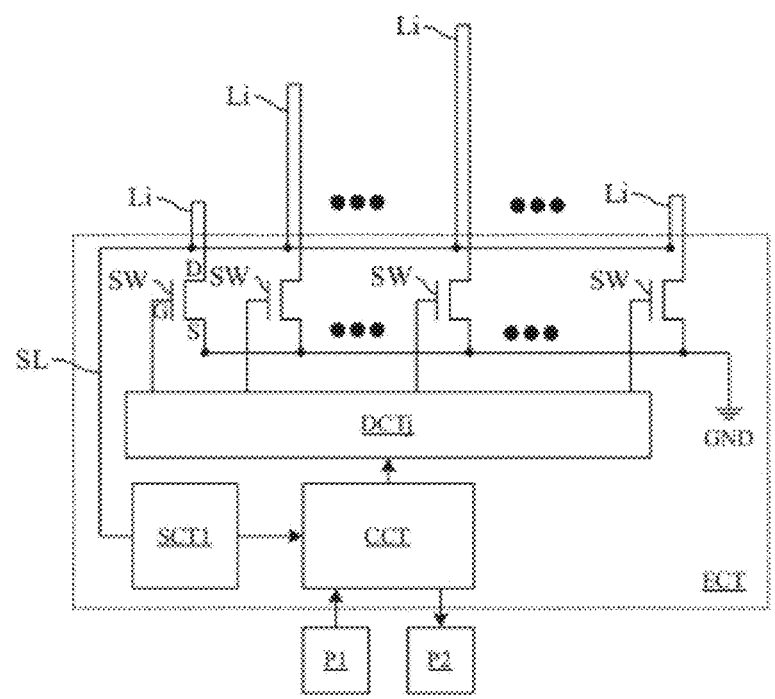
FIG. 5 is an electrical diagram of an evaluation circuit present in the integrated circuit of FIG. 2.

FIG. 5 is the electrical diagram of the evaluation circuit ECT. For the sake of simplicity, only one decoder DCTj (DCT1, DCT2, DCT3, or DCT4) is shown, as well as some conductive lines Li of a series of conductive lines controlled by the decoder DCTj. Each conductive line Li has one end linked to a sense line SL connected to an input of the sense circuit SCT1, and one end linked to ground via a selection switch SW, for example through the drain (D) and source (S) terminals of a MOS transistor. Each selection switch has a control input, for example the gate terminal of the MOS transistor, driven by one output of the decoder DCTj. When the selection switch is ON, the conductive line Li is linked to ground, the sense circuit determines the conductivity state of the conductive line Li with respect to ground and outputs a 0 or a 1 correspondingly.

The control circuit CCT is coupled to the output of the sense circuit SCT1, to the contact pads P1, P2, and to the decoder DCTj. It applies to the decoder DCTj a series of selection signals, each indicating which selection switch SW must be switched ON, and for each selection signal reads the output of the sense circuit SCT1.

The control circuit CCT may implement an evaluation or a built-in test program. Such a program may be stored in a memory (not shown) on the integrated circuit 20, and be launched upon reception of a command received through pads P1, P2. The results of the evaluation program may then be output via pads P1, P2, or may be stored in the memory.

In another embodiment of the disclosure, the evaluation circuit ECT only comprises the decoders DCT1-DCT4, the sense circuit SCT1, and contact pads to control the decoders and read the output of the sense circuit SCT1 from the outside. In this case, the evaluation program is implemented from the outside by means of a test computer. In an even more simplified embodiment, the evaluation circuit ECT only comprises the decoders DCT1-DCT4, the sense line SL, contact pads to control the decoders, a ground pad, and a read pad connected to the sense line SL. In this case, both the launching of the evaluation program and the determination of the continuity state of the conductive lines Li are implemented from the outside.

Referring again to FIG. 3, the wafer 2 may comprise groups 30 of N functional integrated circuit 10, each comprising one evaluation integrated circuit 20 (20, 20', 20", 20'''). Preferably, each evaluation integrated circuit 20 is arranged in a central location of the group. In the embodiment shown, each group comprises eight functional integrated circuits 10 arranged around one evaluation integrated circuit 20.

To manufacture the wafer 20, a set of photolithographic masks comprising the patterning for a group 30 of N functional integrated circuits 10 and one evaluation integrated circuit 20 is used to manufacture the group 30 of integrated circuits. Group 30 is then repeated (stepped) over the entire wafer 2. After dicing of the wafer 2, the evaluation circuits 20 are tested and provide information about the dicing process.

It will be understood that embodiments of the disclosure are not limited to the use of conductive lines. For example, conductive lines Li may not be loop-shaped and their length may be sensed by another means than that consisting of testing the electrical continuity between two ends E1, E2.

For example, in one embodiment, each conductive line is a UHF antenna. An ambient UHF electrical field is generated by a test machine, and the intensity of an AC induced voltage appearing in each conductive line is sensed as a parameter representative of its length. To obtain a more accurate information, the ambient UHF electrical field may be generated at several frequencies, each corresponding to a possible resonance frequency and a corresponding length of the conductive lines.

In another embodiment, each conductive line forms an RF antenna coil of small dimensions, for example a single loop antenna coil. An ambient RF magnetic field is generated by a test machine, and the intensity of an AC induced voltage appearing in each conductive line by inductive coupling is sensed as a parameter representative of whether they are cut or uncut.

Figure 6:
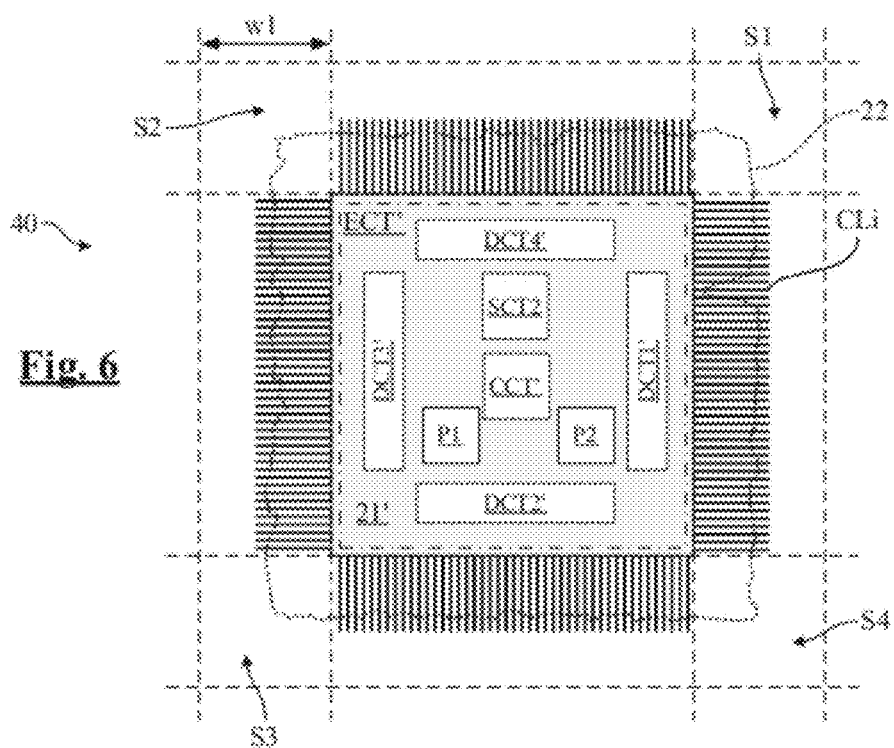
FIG. 6 is a top view of an evaluation integrated circuit according to a second embodiment of the disclosure.

FIG. 6 shows another embodiment 40 of an evaluation integrated circuit according to the disclosure. The evaluation integrated circuit 40 comprises an integrated circuit region 21' and four series of evaluation capacitive lines CLi extending in the scribe lines S1, S2, S3, S4 surrounding the integrated circuit region.

Figure 7:
FIG. 7 is a cross-sectional view of a second embodiment of evaluation lines present in the integrated circuit of FIG. 6.

As shown in FIG. 7, each capacitive line comprises two superimposed conductive lines CL1$i$, CL2$i$ separated by a dielectric material 40. The capacitive lines CLi may be within the wafer material, within dielectric layers, or on the surface of the wafer.

Figure 8:
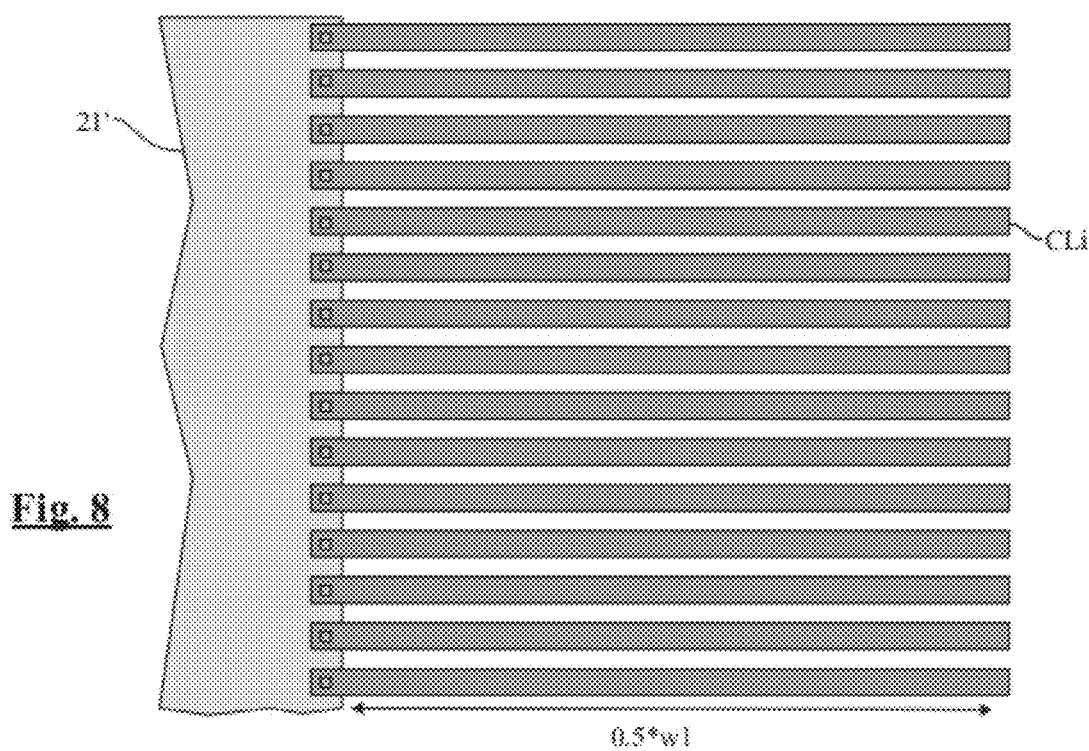
FIG. 8 is an enlarged top view of the evaluation lines present in the integrated circuit of FIG. 6.

As shown in greater detail in FIG. 8, the capacitive lines CLi may have the same length and extend from the integrated circuit region 21' into the scribe lines S1, S2, S3, S4 so that they cover x % of the scribe line width w1, for example 50%.

Referring again to FIG. 6, the evaluation integrated circuit 40 further comprises an evaluation circuit ECT' designed to determine capacitance values representative of the length of the conductive lines. The evaluation circuit ECT' comprises a control circuit CCT', a sense circuit SCT2, decoders DCT1', DCT2', DCT3', DCT4' (one per series of conductive lines), and two input/output contact pads P1, P2 linked to the control circuit CCT. Each decoder DCT1'-DCT4' allows individual access to each conductive line so that its capacitance value may be determined by the sense circuit SCT2. For example, one conductive line CL2$i$ of each capacitive line CLi is connected to ground through a selection switch of a decoder DCTj', and the other conductive line CL1$i$ of each capacitive line CLi is linked to an input of the sense circuit SCT2 (not shown). The sense circuit SCT2 measures the capacitance value of each selected capacitive line CLi and outputs a binary value, for example a 4-bit coded value representative of the length of the capacitive line CLi.

It will be understood by the skilled person that various other embodiments of the disclosure may be provided. For example, the integrated circuit 20, 40 may comprise other test circuits, such as those generally placed within scribe lines, for testing the performances of the functional integrated circuits and wafer fabrication test parameters. In other respects, evaluation lines and sense means of the state of such evaluation lines may also be provided in functional integrated circuits. In that case, it may not be necessary to provide specific evaluation integrated circuits in the wafer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of evaluating a semiconductor wafer dicing process, the method comprising:
    providing evaluation lines extending from an evaluation circuit into a first street of a plurality of streets on a wafer, the wafer further including functional circuits, the evaluation circuit and the functional circuits being arranged in columns and rows that are separated by the plurality of streets, the evaluation lines extending from a perimeter of the evaluation circuit into the first street;
    dicing the wafer in the plurality of streets;
    evaluating information regarding lengths of the evaluation lines; and
    using the information to evaluate the dicing process.

2. The method according to claim 1, wherein the evaluation lines are loop-shaped conductive lines having a first end and a second end and evaluating information regarding the lengths of the evaluation lines comprises determining whether there is electrical continuity between the first and second ends of the loop-shaped conductive lines.

3. The method according to claim 1, wherein the evaluation lines form UHF or RF antennas and evaluating information regarding the lengths of the evaluation lines comprises generating an ambient electrical or magnetic field and sensing a current or voltage induced in the conductive lines.

4. The method according to claim 1, wherein the evaluation lines are capacitive lines and evaluating information regarding the lengths of the evaluation lines comprises sensing a capacitance value of the capacitive lines.

5. The method according to claim 1, wherein the lengths of the evaluation lines vary, wherein one evaluation line has a length that is less than 20% of a width of the street in which it extends.

6. The method according to claim 1, wherein the evaluation lines extend into a plurality of the streets of the wafer.

7. The method according to claim 6, wherein the plurality of functional circuits have a first size and the evaluation circuit has a second size that is substantially the same as the first size.

8. The method according to claim 7, further comprising rejecting or accepting the dies comprising the functional circuits depending upon the evaluation of the dicing process.

9. A semiconductor wafer comprising:
    a plurality of streets;
    a plurality of functional circuits; and
    an evaluation circuit, the plurality of functional circuits and the evaluation circuit arranged in columns and rows with the plurality of streets being respectively located between the columns and rows, the evaluation circuit including evaluation lines extending from a perimeter of the evaluation circuit into at least one of the streets, the evaluation circuit being configured to evaluate information regarding lengths of the evaluation lines.

10. The semiconductor wafer according to claim 9, wherein the evaluation lines are loop-shaped conductive lines.

11. The semiconductor wafer according to claim 9, wherein the evaluation lines form UHF or RF antennas.

12. The semiconductor wafer according to claim 9, wherein the evaluation lines are capacitive lines.

13. The semiconductor wafer according to claim 9, further comprising different groups of evaluation lines, each group of evaluation lines having evaluation lines with varying length lines, a shortest length line in each group having a length which is less than 20% of a width of the street in which the shortest length line extends.

14. The semiconductor wafer according to claim 9, wherein the evaluation circuit has a first perimeter and the plurality of functional circuits have a second perimeter that is substantially the same as the first perimeter.

15. The semiconductor wafer according to claim 9, wherein the evaluation lines are buried in the semiconductor wafer material or in a dielectric layer deposited on the wafer.

16. A semiconductor die comprising:
    an evaluation circuit;
    street portions extending around a perimeter of the evaluation circuit; and
    evaluation lines extending into at least one of the street portions, the evaluation circuit being electrically coupled to the evaluation lines and configured to evaluate information regarding lengths of the evaluation lines.

17. The semiconductor die according to claim 16, wherein the evaluation lines are loop-shaped conductive lines.

18. The semiconductor die according to claim 16, wherein the evaluation lines form UHF or RF antennas.

19. The semiconductor die according to claim 16, wherein the evaluation lines are capacitive lines.

20. The method according to claim 5, wherein the evaluation lines alternate between long and short lines.

* * * * *